United States Patent [19]
Craft

[11] Patent Number: 6,026,508
[45] Date of Patent: Feb. 15, 2000

[54] STORAGE SUB-SYSTEM COMPRESSION AND DATAFLOW CHIP OFFERING EXCELLENT DATA INTEGRITY

[75] Inventor: David John Craft, Austin, Tex.

[73] Assignee: International Business Machines Corporation, Armonk, N.Y.

[21] Appl. No.: 08/847,955

[22] Filed: Apr. 22, 1997

[51] Int. Cl.[7] .................................................. G06F 3/00
[52] U.S. Cl. .......................................... 714/819; 714/766
[58] Field of Search .............................. 364/715.02, 737; 379/93.08; 395/200.77, 185.01; 371/67.01; 704/201; 708/203, 530; 709/247; 714/819, 48, 766

[56] References Cited

U.S. PATENT DOCUMENTS

| | | | |
|---|---|---|---|
| 4,142,243 | 2/1979 | Bishop et al. ...................... | 395/183.13 |
| 5,167,034 | 11/1992 | MacLean, Jr. et al. . | |
| 5,247,638 | 9/1993 | O'Brien . | |
| 5,280,600 | 1/1994 | Van Maren et al. . | |
| 5,293,388 | 3/1994 | Monroe et al. . | |
| 5,384,780 | 1/1995 | Lomp et al. . | |
| 5,410,671 | 4/1995 | Elgamal et al. . | |
| 5,446,839 | 8/1995 | Dea et al. . | |
| 5,455,576 | 10/1995 | Clark, II et al. .......................... | 341/50 |
| 5,524,244 | 6/1996 | Robinson et al. . | |
| 5,703,887 | 12/1997 | Heegard et al. .......................... | 371/42 |

OTHER PUBLICATIONS

Boyd, C.; Cleary, J.G.; Irvine, S.A.; Rinsma–Melchert, I.; Witten, I.H.; Integrating error detection into arithmetic coding; IEEE Transactions on Communications, Jan. 1997.

Bright, J.D.; Sullivan, G.F.; On–Line error monitoring for several data structures; 1995. FTCS–25. Digest of Papers., Twenty–Fifth International Symposium on Fault–Tolerant Computing, Jun. 1995.

"Direct Access Storage Device Compression and Decompression Data Flow," IBM Technical Disclosure Bulletin, vol. 38, No. 11, Nov. 1995.

*Primary Examiner*—Albert De Cady
*Assistant Examiner*—Esaw Abraham
*Attorney, Agent, or Firm*—Sawyer & Associates; Casimer K. Salys

[57] ABSTRACT

A system and method for providing data compression with high integrity is disclosed. In one aspect, the system and method includes a first interface, a second interface, and a storage. In this aspect, the method and system include providing a first compressor/decompressor coupled to the first interface and the storage providing and a second compressor/decompressor coupled to the second interface and the storage. The first compressor/decompressor compresses data from the first interface, decompresses compressed data from the storage, and provides a first data stream. The second compressor/decompressor compresses data, decompresses compressed data, and provides a second data stream. Each compressor/decompressor can monitor the input and output of the other compressor/decompressor using a common shared interface to the storage. The first compressor/decompressor monitors the second data stream and compares the second data stream to the first data stream if the second compressor/decompressor is a master device, and vice versa. In another aspect, the system has a storage means and an interface. The method and system include providing a single compressor/decompressor and error comparing means coupled with the compressor/decompressor. The compressor/decompressor alternatively compresses a portion of data and decompresses a portion of compressed data. The error comparing means compare the portion of data to the portion of the compressed data.

32 Claims, 4 Drawing Sheets

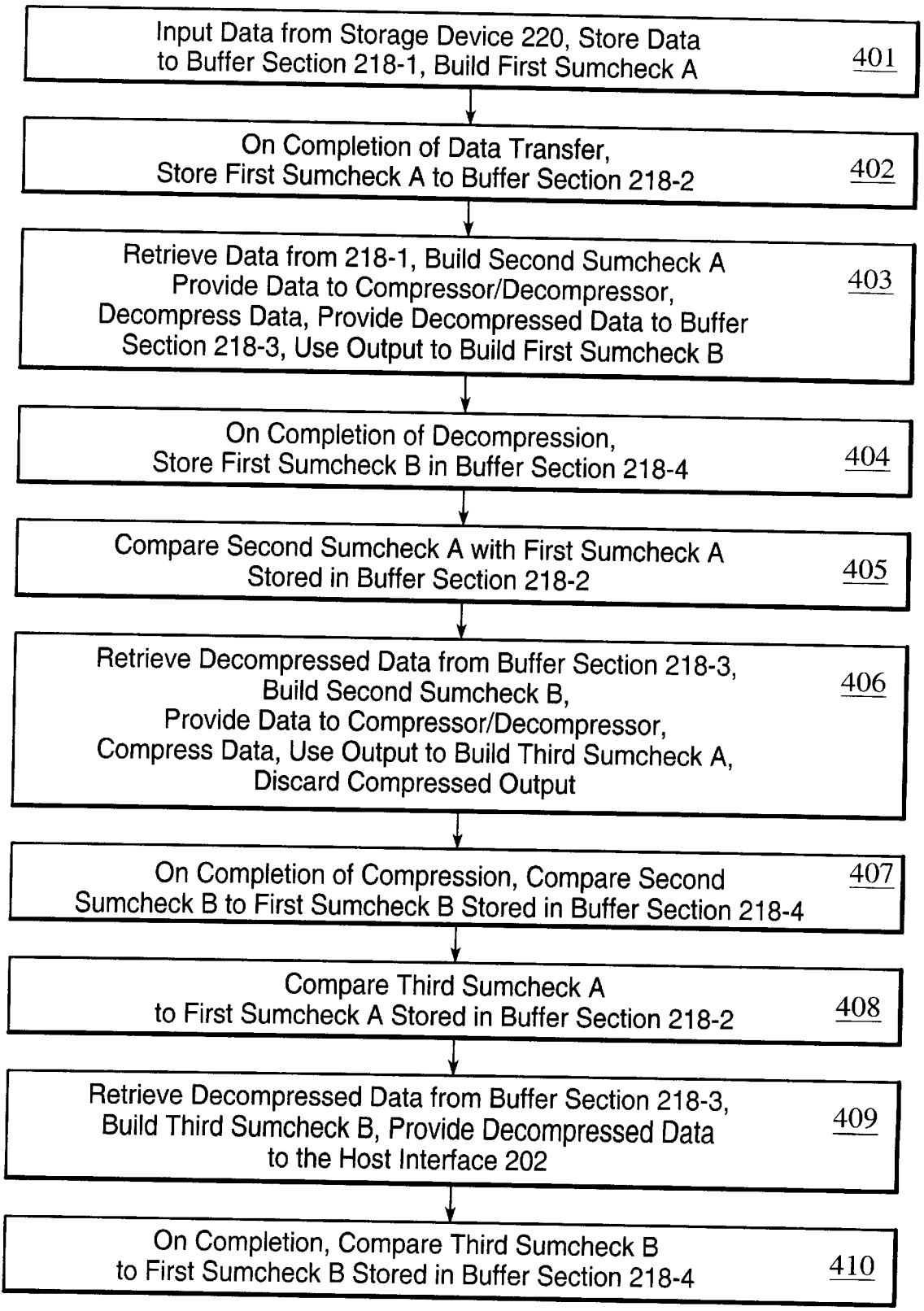
FIG. 5     400

STORAGE SUB-SYSTEM COMPRESSION AND DATAFLOW CHIP OFFERING EXCELLENT DATA INTEGRITY

FIELD OF THE INVENTION

The present invention relates to a method and system for high integrity compression of data and more particularly to a method and system for implementing a data compressor/decompressor, host interfacing, and data integrity checking chip or component which can provide the requisite data integrity at the appropriate cost over a range of data storage products or subsystems.

BACKGROUND OF THE INVENTION

Data compression, for example for archiving to a tape, is increasingly important to users. It is vital to insure that compression and storage operations, or retrieval and decompression operations, are all carried out with the highest integrity, so that the original data presented to the system for archival storage can be retrieved correctly. In other words, the information written to the storage medium should be a correct compressed representation of the original data. Similarly, when this stored information is retrieved and decompressed, there should be no additional errors introduced during the decompression. Similarly, any transfers of information from one part of the system to another or buffering of information within the system should not introduce errors.

Providing high data integrity is a problem particularly for "high end" systems, where the data being compressed and stored is valuable or fundamental to a user's operation. Example of such systems are large scale financial data processing applications such as banking or credit card processing. Users who must store such data are willing to purchase more expensive systems in order to ensure greater integrity of their data.

Although error correcting codes are a conventional method of ensuring errors are not introduced into the data, these codes are inappropriate for providing integrity during compression and decompression. Instead, such codes are primarily used to account for other sources of error, such as defects in the storage media. Consequently, most error correction codes are merely appended to and based on the data input to the storage media. As a result, if an error were to occur in the data compression process, an error correction code will be formed using the incorrect compressed information. The error correction code will preserve this error as it is written to and subsequently retrieved from the storage medium.

One conventional method for providing high data integrity is to build a separate data compressor and decompressor. These can then operate at the same time. The data to be stored is provided to the compressor by a host system. A sumcheck is built on this data as it passes into the compressor. As the compressed result is output from the compressor, it is provided to both the decompressor and to the storage medium, such as a tape. The decompressor reconstructs the original data. As the reconstructed data is output from the decompressor, it is discarded. However, a sumcheck is built on the reconstructed data. This decompressor sumcheck is then compared with that from the original data fed into the compressor. If the sumchecks agree, there is a very high probability that the data integrity has been preserved throughout the compression/decompression process, and the system can proceed to process more data.

Note that this conventional system could also be implemented using a buffer. Different sections of this buffer can be used to store data in different states. For example, one section might store uncompressed data as received from the host over the interface and another section might store compressed data which is awaiting being written to the storage medium. However, such a scheme usually includes error checking to ensure that the data is not lost or corrupted during buffer storage/retrieval operations. In addition, checks must still be performed on compression/decompression operations, to ensure their integrity.

Although the conventional system as described above does ensure data integrity, it is rather expensive and only a relatively small number of such systems are expected to be made. A simultaneous compression/decompression capability is only required by this class of product. The same is true for the dual host interface capability. As a result, a highly integrated and specialized chip is required for a relatively low volume product. Most integrated circuit manufacturers are reluctant to produce such components in relatively small quantities.

At the "low end" range of such storage systems, a different situation prevails. Although data integrity is still desirable, the prices of such storage systems are much lower. The number of systems sold is orders of magnitude greater than for high end systems. Because of the cost of the conventional chip described above, it cannot be used in these products. In addition, the low end systems typically require only one interface because only one host is attached. Accordingly, what is needed is a system and method for providing low end systems with a compressor, decompressor and single interface, using simpler and less expensive circuitry, while ensuring the data integrity of high end system. Ideally, this same component could also be used in the high end systems to provide an equivalent or better data integrity level than the conventional solution. It would be desirable for the component in high end systems to include an option to provide multiple interface capabilities. Low end systems could then benefit from the low cost of such a component, with the high end data integrity as an additional competitive advantage. High end systems could also benefit from the lower costs associated with manufacturing economies of scale for the much higher low end system chip volumes. The present invention addresses such a need.

SUMMARY OF THE INVENTION

The present invention provides a method and system for providing data compression with high data integrity. In one aspect, the method and system include a first interface, a second interface and a storage means. The method and system comprises first compression/decompression means coupled to the first interface and the storage means. The first compression/decompression means compresses data provided via the first interface and decompresses data from the storage means. The first compression/decompression means also provides a first data stream. The method and system further comprises a second compression/decompression means coupled to the second interface and the storage means. The second compression/decompression means compresses data provided via the second interface and decompresses data from the storage means. The second compression/decompression means also provides a second data stream. Each compression/decompression means is able to monitor both the input and the output of the other via a common shared interface to the storage means. The first compression/decompression means monitors the second data stream and compares the second data stream to the first data stream if the second compression/decompression means is a master device. The second compression/ decompression means monitors the first data stream and compares the first data stream to the second data stream if the first compression/decompression means is the master device.

In another aspect, the method and system further provide high integrity compression of data at relatively low cost. In this aspect, the method performs a first error check on the data. The method stores the first error check and provides the data to a compression/decompression means, which compresses the data to provide a data stream. The data stream is stored and provided to the compression/decompression means, which decompresses the data stream. The method performs a second error check on the decompressed output and compares the second error check to the first error check.

According to the system and method disclosed, the present invention provides compression and decompression of data with very high levels of integrity, using a simpler and cheaper compressor/decompressor. By the use of a first and second compressor/decompressor component in one aspect of the method and system, dual host interfacing and an even better level of compression hardware checking is provided. In another aspect, the system and method may use a single compressor/decompressor. In this aspect, the method and system are able to offer relatively high data integrity checking at low cost. The method and system offer further advantages in terms of economies of scale, as a single compressor/decompressor components can be produced in higher volume.

BRIEF DESCRIPTION OF THE DRAWINGS

FIG. 5 is a flow chart depicting a method for providing data decompression having high integrity at relatively low cost.

DETAILED DESCRIPTION OF THE INVENTION

The present invention provides a method and system for providing data compression and decompression with high data integrity. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
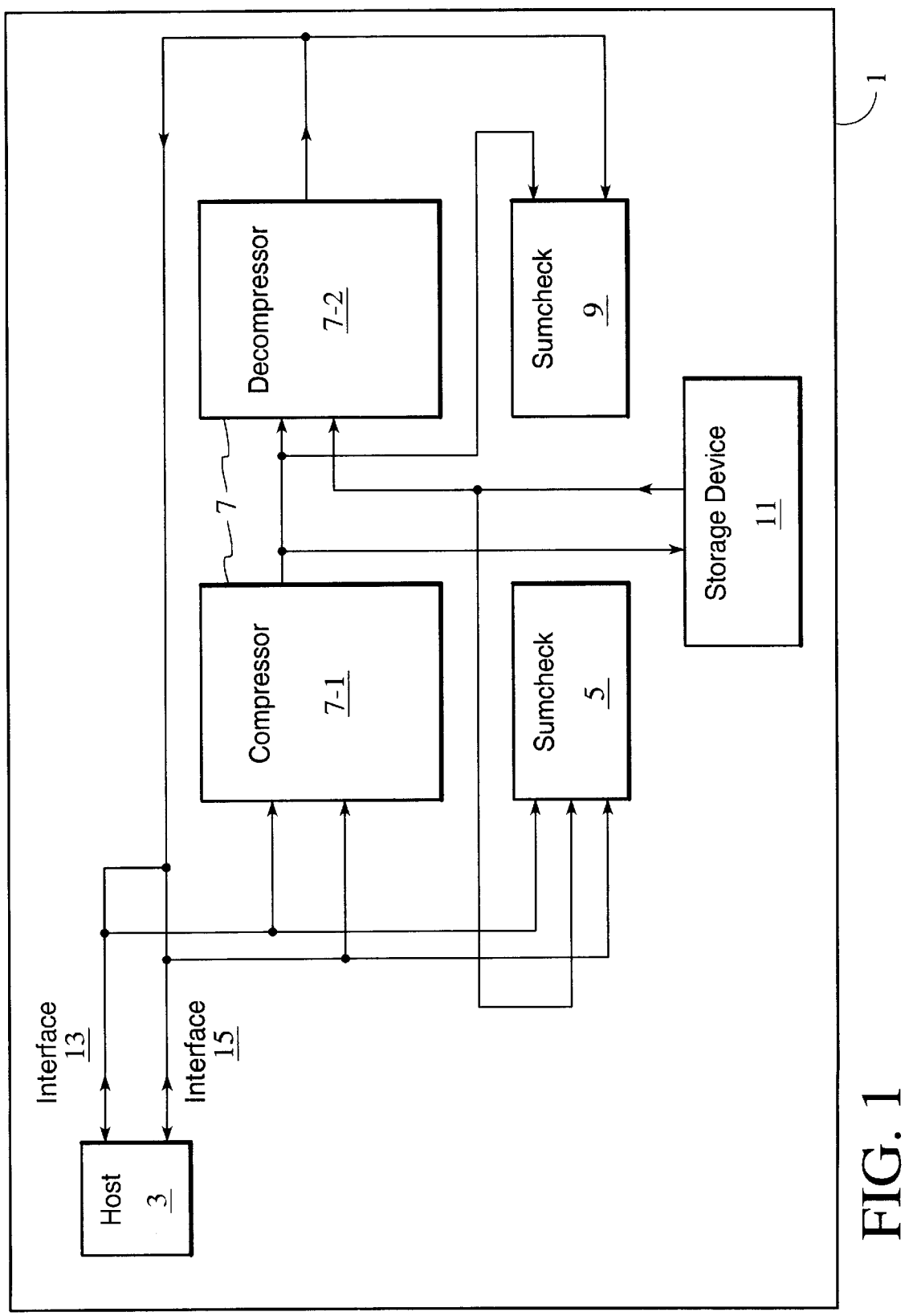
FIG. 1 is a block diagram of a conventional system for providing data compression and decompression.

FIG. 1 is a block diagram of a conventional system 1 for compressing or decompressing data. The single compressor/decompressor 7 of the conventional system 1 can perform compression and decompression simultaneously. In the system 1, data to be stored is provided to the compressor by a host system 3 through one of the dual interfaces 13 and 15. A sumcheck unit 5 builds a sumcheck on the data provided by the host 3. The compressor 7-1 of the compressor/decompressor 7 then compresses the data.

The compressed result of a portion of the data from the compressor 7-1 is provided to both the decompressor 7-2 and the storage device 11. The storage device 11 is typically a tape. The decompressor 7-2 of the compressor/decompressor 7 reconstructs the original data. Consequently, compression and decompression typically occur simultaneously.

Typically, data reconstructed by the decompressor 7-2 is discarded. However, prior to being discarded, the sumcheck unit 9 builds a sumcheck from the reconstructed data. The result of the sumcheck built on the reconstructed data is then compared to the sumcheck built on the original data to ensure that the original and reconstructed data are the same. For a decompression operation, data is provided to the decompressor 7-2 by the storage device 11. The sumcheck unit 5 builds a sumcheck on the compressed data. The decompressor 7-2 then decompresses the data. The decompressed result of a portion of the data from the decompressor 7-2 is provided to both the compressor 7-1 and the host 3. The compressor 7-1 of the compressor/decompressor 7 reconstructs the compressed data. Again, compression and decompression typically occur simultaneously.

Typically, data reconstructed by the compressor 7-1 is discarded. However, prior to being discarded, the sumcheck unit 9 builds a sumcheck from the compressor output. The result of the sumcheck built on the reconstructed data is then compared to the sumcheck built on the compressed data to ensure that the compressor output and the original compressed data are the same. Consequently, high data integrity is achieved in both compression and decompression.

Note that the system 1 could also be implemented using a data buffer. Different sections of the buffer could be used to store data of different states. However, additional error checking would be implemented to ensure that no errors were introduced during storage in the buffer.

Although the system 1 shown in FIG. 1 compresses data and assures the compressed data's integrity, one of ordinary skill in the art will readily realize that the conventional system 1 is expensive. In addition, only a relatively small number of such systems are expected to be sold every year. The system 1 requires simultaneous compression and decompression, as well as the dual interfaces, interfaces 13 and 15. As a result, the compressor/decompressor 7 requires highly integrated circuitry. Because relatively few high end systems 1 are sold and the compressor/decompressor 7 requires highly integrated circuitry, manufacturers are reluctant to fabricate the chip in the relatively small numbers expected to be sold per year.

One of ordinary skill in the art will also recognize that at the low end of such storage systems, the compressor/decompressor 7 cannot be used because of the expense. Low end systems also typically require only one interface because only one host is attached. However, one of ordinary skill in the art will readily realize that the data integrity provided by the system 1 is still important. Finally, although low end systems are less expensive, significantly higher numbers of low end systems are sold.

The present invention provides for a method and system for providing data compression and decompression having high integrity in both high end and low end systems through the use of a standardized, relatively inexpensive compressor/decompressor. The present invention will be described in terms of CRAM integrated LZ1 compression algorithm circuitry, used in a system for data storage on a tape.

However, one of ordinary skill in the art will easily appreciate that the method and system are effective for other compression/decompression algorithms and for other types of storage devices. One of ordinary skill in the art will also recognize that although some other functions of the method and system, such as autoblocking, are not discussed, these may be performed in conjunction with the method and system described herein.

A high-speed hardware LZ1 compressor typically requires use of a content addressable memory, or "CAM". In contrast, a decompressor typically only requires a random access memory, or "RAM". The CAM can also function as a RAM if an address decoder is provided. This requires less chip area than if using separate CAM and RAM arrays.

A CRAM is capable of both data compression or data decompression, but not both simultaneously. The CRAM is one type of compressor/decompressor that can be standardized, and is relatively inexpensive and simple to fabricate. Consequently, the method and system of the present invention will be described using CRAM based compressor/decompressors. However, nothing limits the method and system to this type of compressor/decompressor.

Figure 2:
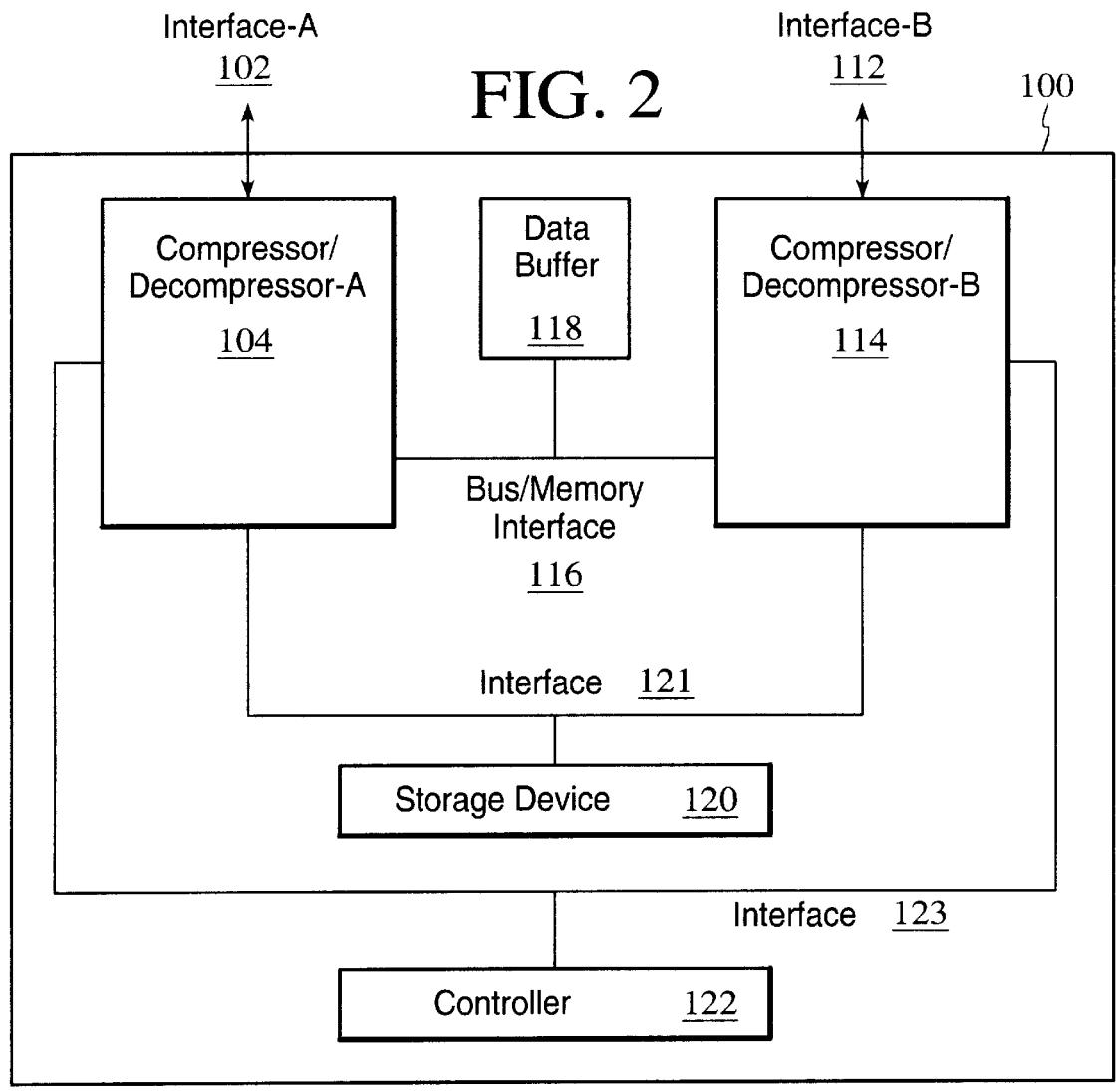
FIG. 2 is a block diagram of an embodiment of a system for providing data compression having high integrity.

To more particularly illustrate the method and system in accordance with the present invention, refer now to FIG. 2 depicting a block diagram of one embodiment 100 of such a system. The system 100 of the present invention includes two CRAM compressor/decompressors 104 and 114, each with a host interface, designated as interface A 102 and interface B 112.

The two compressor/decompressors 104 and 114 share a common data buffer interface 116 to a storage buffer 118. The two compressor/decompressors 104 and 114 also share a common interface 121 to the storage device 120. In one embodiment the storage device 120 is a tape drive. In a particular embodiment, the interfaces A 102 and B 112 may be coupled to the data buffer interface 116. In another embodiment, interface A 102 may be coupled to compressor/decompressor 104 and interface B 112 may be coupled to compressor/decompressor 114. In addition, data buffer interface 116 may be coupled to the compressor/decompressor 104 and 114, or to the common interface 121 to the storage device 120. The compressor/decompressors 104 and 114 may also be coupled through a common interface 121 to the storage device 120.

In the system 100 of FIG. 2, the compressor/decompressors 104 and 114 share a common interface 123 to the system controller 122. In one embodiment, the system controller is a microcontroller of some kind. The function of the system controller 122 is to interpret commands received over the interfaces A 102 or B 112 and to control overall operation of the system 100 accordingly.

The system controller 122 directs which of the two compressor/decompressors 104 or 114 is to receive or transmit data over its host interface A 102 or B 112, respectively. The system controller 122 also determines whether each of compressor/decompressors 104 and 114 operates as compression or decompression devices The system controller 122 directs how the data is coupled between interfaces A 102 or B 112, compressor/decompressors 104 and 114, and the shared interface 121 to the storage device 120 and the shared data buffer interface 116 to the data buffer storage 118.

The system 100 is particularly beneficial in high end data storage and retrieval systems, or other systems, in which the cost of providing two identical components containing compressor/decompressors 104 and 114 is not excessive.

In a preferred embodiment, data is provided to or read from the system 100 through either interface A 102 or interface B 112. In one embodiment, the two interfaces A 102 and B 112 are SCSI interfaces. Thus, the system 100 includes two interfaces, as required in a high end storage sub-system. The controller 122 determines which interface is used for any given operation. In one embodiment of the system 100, the data to be compressed is first stored into the data buffer 118 via the interface 116. In a particular embodiment, the buffer 118 is a 4 megabyte (MB) RDRAM. A sumcheck may be built on the data as it is stored into buffer 118 via interface 116 to ensure the data integrity is preserved during storage. In addition, the buffer 118 may have separate sections for storing data, compressed data, and sumchecks for each set of data. In one embodiment, data from the buffer 118 is later retrieved over this same interface 116, and is then synchronously supplied to both compressor/decompressors 104 and 114.

If a sumcheck is built on data input to the buffer 118 via interface 116, a sumcheck is generally built again as this same data is retrieved from the buffer 118 via interface 116. Comparison of the two sumchecks verifies that no data errors have been introduced during storage in and retrieval from the data buffer 118.

In one embodiment of the system 100, the common bus/memory interface 116 is a RAMBUS. A RAMBUS requires fewer physical connections on the two compressor/decompressor chips 104 and 114 and provides a greater bandwidth. Currently, a RAMBUS interface and RDRAM memory used as a data buffer can support a bandwidth of up to 500 MB per second.

The controller 122 designates one of compressor/decompressors 104 and 114 as a MASTER, and the other one as a SLAVE. In a preferred embodiment, the MASTER is the compressor/decompressor 104 or 114 which includes the host interface A 102 or B 112 which is to be the active interface for the operation.

The data is first received by the MASTER over its host interface and stored to one section of the data buffer 118 via interface 116. The MASTER subsequently retrieves this data, also via interface 116, to perform data compression. At the same time, the SLAVE is able to access the same data via the common interface 116, and perform an identical compression operation, synchronously with the MASTER. In one embodiment, the sumcheck described earlier may be used to ensure the integrity of the data retrieved from the buffer 118.

The MASTER will, during this compression operation, periodically store the compressed result data to a different area of the buffer 118 via the common interface 116. In a preferred embodiment, a separate sumcheck is built on this data as it is stored. This sumcheck is used later to verify integrity as the compressed data stored in the buffer 118 is retrieved to be written to the storage device 120.

In a preferred embodiment, the SLAVE does not write compressed result data to the buffer 118. Instead it simply observes each data package written by the MASTER into the buffer 118. In one embodiment, a SLAVE accomplishes this by observing the activity on the common interface 116. The SLAVE compares the data that is being written by the MASTER to the buffer 118 with the SLAVE's own compressed data. Any discrepancies between the MASTER's data stream provided to buffer 118 and the SLAVE's data stream may be considered errors due to compression of the data. In one embodiment, the data stream comparison is accomplished by comparators provided in each compressor/ decompressor component 104 and 114. Similarly, in one embodiment, the sumcheck build/checking process is accomplished using hardware circuitry provided within each compressor/decompressor component 104 and 114.

A decompression operation is performed in a similar fashion. Compressed data read from the storage device 120 can be synchronously and directly provided to both MASTER and SLAVE compressor/decompressors 104 and 114. In another embodiment, the compressed data read from the storage device 120 can be first stored into a section of buffer 118 via interface 116. Either compressor/decompressor 104 or 114 can store the compressed data in the buffer 118. In one embodiment, a sumcheck can be built on the compressed data stored in and retrieved from the buffer 118 to ensure integrity of the data on subsequent retrieval. The data retrieved from the buffer 118 is provided to both compressor/decompressors 104 and 114.

In a preferred embodiment, during the decompression operation, compressor/decompressors 104 and 114 both operate synchronously. The data delivered directly over the interface from the storage device 120 or from data appearing on interface 116, as it is fetched by the MASTER from an area of the buffer 118, is decompressed. The compressor/decompressor 104 or 114 designated as the MASTER is determined by the controller 122. In a preferred embodiment, the controller 122 determines which compressor/decompressor 104 or 114 is the master based on which host interface A 102 or B 112 is to be active.

The MASTER either stores the decompressed data to a separate area of the data buffer 118, or delivers it directly to its host interface A 102 or B 112. In a preferred embodiment, the decompressed data appears on the common data buffer storage interface 116 regardless of whether the decompressed data is provided to the buffer 118 or directly to the MASTER's host interface A 102 or B 112. In one embodiment, if the result data is to be buffered, the same sumcheck method described earlier is used to ensure integrity. If buffering the result is not required, in one embodiment, the common interface 116 is a communication channel between the MASTER and SLAVE components, so the SLAVE is aware of the MASTER's decompressed data stream.

In a preferred embodiment, the SLAVE does not store data to the buffer 118 or provide data to the SLAVE's host interface A 102 or B 112. Instead, the SLAVE observes decompressed data placed by the MASTER on the common interface 116, and compares this to the result of the SLAVE's own operation. Any discrepancies may be considered errors due to the decompression of the data.

In a preferred embodiment, the MASTER stores its resultant, decompressed data into buffer 118. The decompressed data is subsequently retrieved by the MASTER to be sent to the host via the associated interface A 102 or B 112. In a preferred embodiment, a sumcheck verifies that data integrity has been preserved during the buffering operation.

In the system 100, controller 122 can either designate compressor/decompressor 104 as a MASTER and compressor/decompressor 114 as a SLAVE, or designate compressor/decompressor 114 as a MASTER and compressor/decompressor 104 as the SLAVE. In a preferred embodiment, both compressor/decompressors 104 and 114 are identical, with the same compressor/decompressor, data comparator and sumcheck circuitry.

Note that the only hardware error not detected by the system 100 is an identical and simultaneous error made by the two independent compressor/decompressors 104 and 114. This affords a much higher level of hardware error detection capability than conventional systems.

Figure 3:
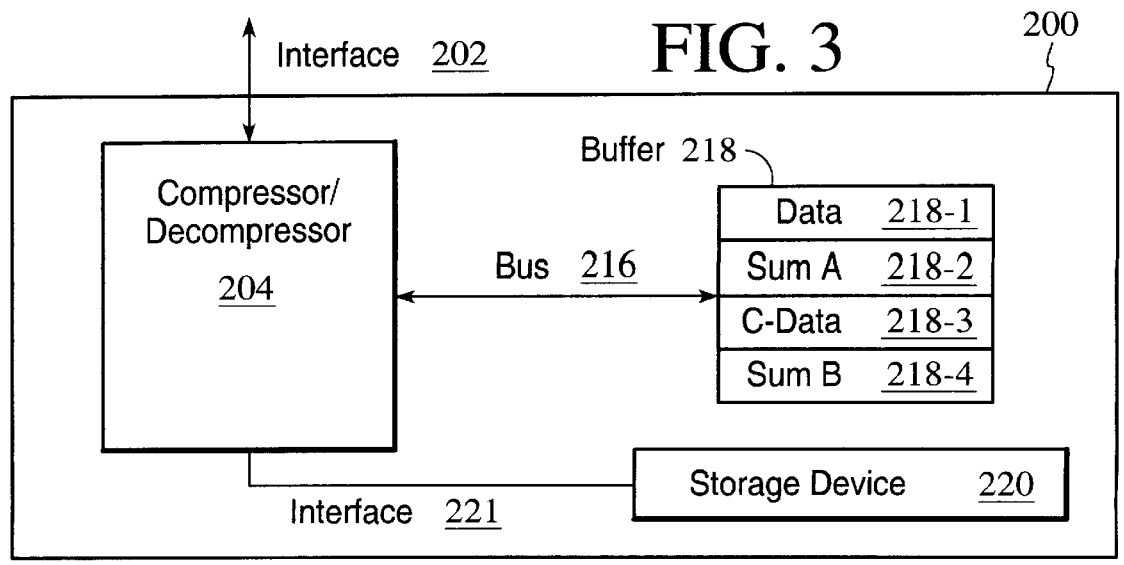
FIG. 3 is a block diagram of an embodiment of a system for providing data compression having high integrity at relatively low cost.

FIG. 3 is an embodiment of a low end system 200. In the lower end system 200, a single compressor/decompressor 204 can be used to provide extremely high data integrity at a lower cost.

The system 200 includes an interface 202 to a host. In a preferred embodiment, the interface 202 is a SCSI interface. The system 200 further comprises a compressor/decompressor 204. In a preferred embodiment, compressor/decompressor 204 uses a CRAM. The compressor/decompressor 204 is coupled to a buffer 218 via interface 216. In one embodiment, the buffer 218 is divided into four sections, 218-1 through 218-4. The storage device 220 may be coupled direct to the compressor/decompressor 204, or may be coupled to the buffer 218 via interface 216. In one embodiment, the storage device 220 is a tape. The host interface 202 may be coupled either to the buffer 218 via interface 216, or it may be coupled direct to the compressor/decompressor 204. In a preferred embodiment, all data transfers are performed via the buffer 218.

Figure 4:
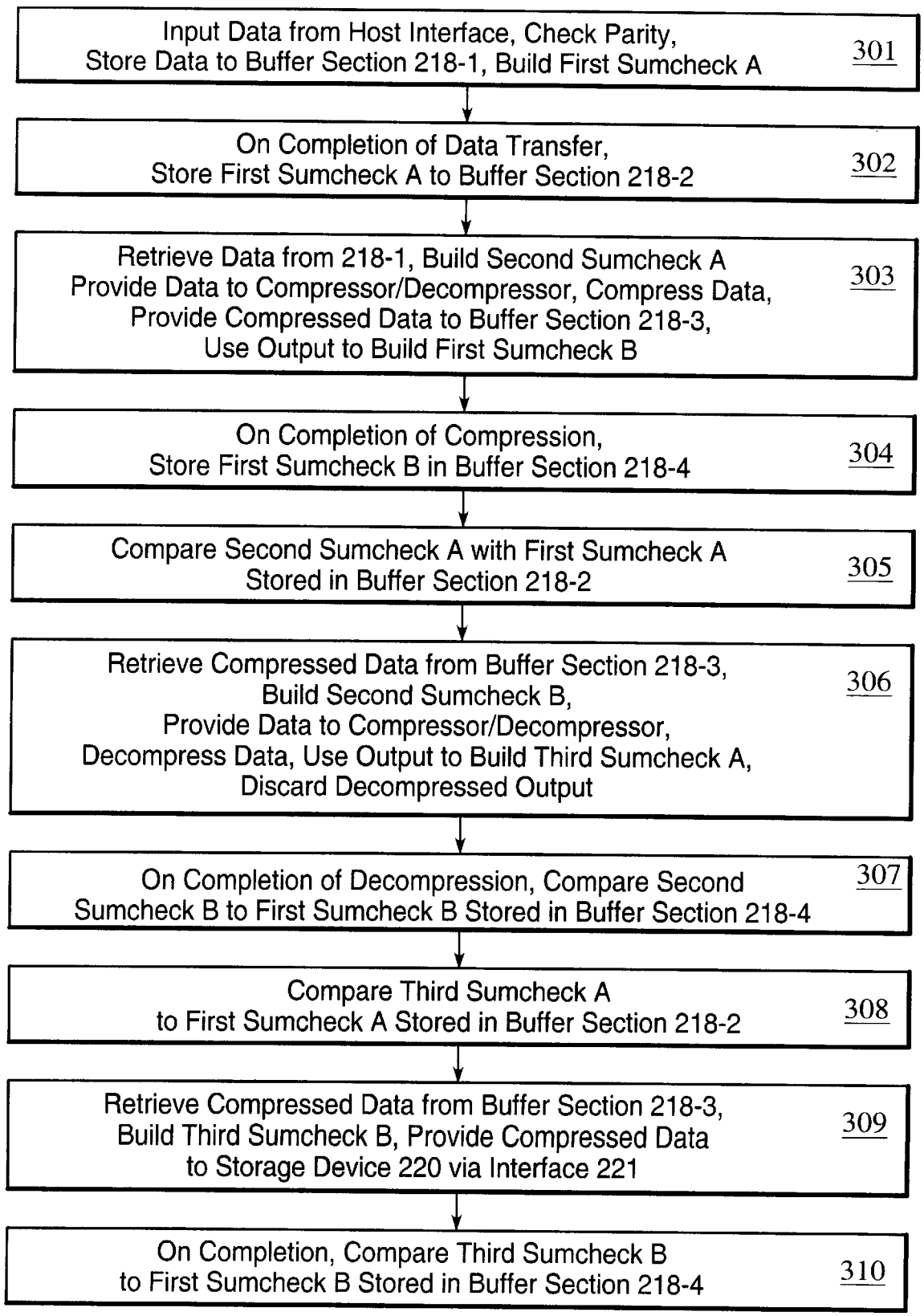
FIG. 4 is a flow chart depicting a method for providing data compression having high integrity at relatively low cost.

FIG. 4 depicts a flow chart of method 300 for compressing data using system 200 of FIG. 3. Referring now to FIG. 4, data is provided to the system 200 through step 301. In step 301, as the data is input via host interface 202, it is parity checked, and then stored into area 218-1. A sumcheck A is built as the data is input also via step 301. The sumcheck is stored in the section 218-2 of the buffer 218, via step 302.

Next, the data is to be compressed. The data is retrieved from the buffer area 218-1 and fed to the compressor in step 303. The compressed data stream is stored in the section 218-3 of the buffer 218, also in step 303. As the data is retrieved and compressed, sumcheck A is built again on the input data via step 303. In step 305, the sumcheck A built via step 303 is compared on completion with the sumcheck A stored in 218-2 in step 302. This verifies that there has been no corruption of the source data in the storage/retrieval process. Another sumcheck B is also formed in step 303 on the compressed result data stored in 218-3. Sumcheck B is eventually stored in 218-4 via step 304.

To check the compression process, step 306 fetches the compressed data stored in section 218-3 and feeds the compressed data to the compressor/decompressor 204 for decompression. The output from the compressor/decompressor is discarded. In step 306, a sumcheck B is, however, built again on the compressed data from section 218-3. Another sumcheck A is also built on the decompressed, discarded data via step 306.

In step 307, the sumcheck B is compared with the sumcheck B built in step 303 and stored in 218-4. In step 308, the sumcheck A is compared with the sumcheck A built in step 301 and stored in section 218-2. If these sumchecks both agree, it is highly likely that the compression/decompression process is without error. Finally, in step 309, the compressed data in section 218-3 is fed to the storage device 220 via the interface 221. As the compressed data in section 218-3 is retrieved, a sumcheck B is again built in step 309. The sumcheck B is then compared with the value in 218-4, in step 310, to ensure that the stored data has not been corrupted.

FIG. 5 depicts a method 400 for decompressing the data, using system 200 of FIG. 3. Referring now to FIG. 5, data is provided to the system 200 via interface 221 from the storage device 220, through step 401. This data is stored in the section 218-1 of the buffer 218. In step 401, a sumcheck A is built as compressed data is stored in the section 218-1. The sumcheck A is then stored in area 218-2, via step 402.

Next, the data is decompressed. The data is retrieved from the section 218-1 and fed to the compressor/decompressor 207 in step 403. The resultant, decompressed data stream is stored in the section 218-3, also in step 403. Simultaneously, a sumcheck A on the data retrieved from the section 218-1 is built again via step 403. This sumcheck A is to be compared on completion with that stored in section 218-2 via step 405, to verify that there has been no corruption of the data during the storage/retrieval process. A second sumcheck B is built on the decompressed data which is stored in 218-3, and this is eventually stored in 218-4, in step 404.

To check the decompression process, the decompressed result data is next fed to the compression circuitry in step 406 by fetching the data from 218-3. Step 406 also builds a sumcheck B. The compressed result data is discarded, but another sumcheck A is built from it via step 406. Then the B sumcheck is compared with that in 218-4, in step 407. In step 408, the A sumcheck is compared to that in 218-2.

If both sumchecks A and B agree with the sumchecks stored in sections 218-4 and 218-2, respectively, the decompression/compression process is highly likely to be without error. Finally, the decompressed data held in 218-3 is retrieved and fed to the host via interface 202 in step 409. As this data is retrieved, a sumcheck B is again built via step 409. This sumcheck B is compared with that in section 218-4, via step 410, to ensure that there has been no corruption of the decompressed data during storage and retrieval.

Referring back to FIG. 3, in one embodiment, the bus 216 is a RAMBUS and the interface 202 is a SCSI interface. Currently, a SCSI interface can transfer data at a rate of 40 MB per second. For the system 200 to sustain high integrity data compression, compressor/decompressor 204 must compress and then decompress each block of data quickly enough to keep up with the SCSI transfer rate. To accomplish this, it is necessary that compressor/decompressor 204 can compress or decompress data at a rate of approximately 80 MB per second. Note that a RAMBUS having a data transfer rate of 500 MB per second is capable of accommodating the total bandwidth requirements of all data transfers in and out of buffer 218, as needed for sustained operation.

A method and system have been disclosed for providing high integrity data compression/decompression capability within both high end and low end storage systems. The compressor/decompressor used in the embodiments discussed above, a CRAM, is less expensive and simpler to fabricate than currently used approaches. In one embodiment, the method and system provide high integrity data compression/decompression by designating one of two identical compressor/decompressors as a MASTER and the other as a SLAVE. Both then operate simultaneously to compress or decompress data. The MASTER places its result data into buffer storage, while the SLAVE monitors this data stream and checks that it is identical to its own result data stream.

In another embodiment, only a single compressor/decompressor component is provided. The single compressor/decompressor is then used either to compress and then decompress a block of data, or alternatively to decompress and then compress a block of data. Sumchecks are built at each stage, and compared with previous stored sumcheck values, to check both the integrity of the data storage buffer hardware and the compression/decompression hardware. As a result, each embodiment provides compression/decompression capability as well as data buffer storage capability, with extremely high data integrity.

Accordingly, the system and method provide compression and decompression of data with very high levels of integrity using a simpler and cheaper component. Furthermore, by the use of two such components in high end systems, dual host interfacing and a better level of compression hardware checking may be provided. The low end systems can use a single component only and are thus able to offer data integrity checking comparable to the current high end systems. The use of a single identical component across the whole range of systems offers further advantages in terms of economies of scale, as a single design is now able to be produced in high volume.

Although the present invention has been described in accordance with the embodiments shown, it will be readily recognized by one of ordinary skill in the art that there could be variations to the embodiments, and those variations would be within the spirit and scope of the present invention. Accordingly, many modifications may be made by one of ordinary skill in the art without departing from the spirit and scope of the appended claims.

What is claimed is:

1. A system for providing data compression with high data integrity, the system including a first interface, a second interface and a storage means, the system comprising:

first compression/decompression means coupled to the first interface and the storage means, the first compression/decompression means for compressing data provided via the first interface, and for decompressing data from the storage means, the first compression/decompression means also providing a first data stream; and second compression/decompression means coupled to the second interface and the storage means, the second compression/decompression means for compressing data provided via the second interface and for decompressing data from the storage means, the second compression/decompression means also providing a second data stream, each of the first and second compression/decompression means being able to monitor both the input and output of the other via a common shared interface to the storage means;

wherein the first compression/decompression means monitors the second data stream and compares the second data stream to the first data stream if the second compression/decompression means is a master device, and wherein the second compression/decompression means monitors the first data stream and compares the first data stream to the second data stream if the first compression/decompression means is the master device.

2. The system of claim 1 wherein the first compression/decompression means is coupled to the second compression/decompression means through a common bus.

3. The system of claim 2 wherein the common bus further comprises a RAMBUS.

4. The system of claim 3 wherein:

the first compression/decompression means further comprises a first content addressable memory and a first decoder coupled to the first content addressable memory; and the second means further comprises a second content addressable memory and a second decoder coupled to the second content addressable memory.

5. The system of claim 4 further comprising a controller coupled to the first compression/decompression means and the second compression/decompression means for designating one of the first compression/decompression means or the second compression/decompression means as the master device and the other of the first compression/decompression means or the second compression/decompression means as a slave device.

6. The system of claim 5 wherein the first compression/decompression means further comprises a first comparing means for comparing the second output to the first output if the second compression/decompression means is a master device; and the second compression/decompression means further comprises a second comparing means for comparing the first output to the second output if the first compression/decompression means is a master device.

7. The system of claim 6 wherein the first comparing means further comprises a comparator; and the second comparing means further comprises a comparator.

8. The system of claim 7 wherein the controller designates the first compression/decompression means as the master device and the second compression/decompression means as the slave device when data is provided via the first interface, and designates the first compression/decompression means as the slave device and the second compression/decompression as the master device when the data is provided via the second interface.

9. A method for providing data compression with high data integrity comprising the steps of:
providing a first compression/decompression means coupled to a first interface and a storage means, the first compression/decompression means for compressing data provided via the first interface, and for decompressing data from the storage means, the first compression/decompression means also providing a first data stream;
providing a second compression/decompression means coupled to the second interface and the storage means, the second compression/decompression means for compressing data provided via the second interface and for decompressing data from the storage means, the second compression/decompression means also providing a second data stream;
wherein the first compression/decompression means monitors the second data stream and compares the second data stream to the first data stream if the second compression/decompression means is a master device; and
wherein the second compression/decompression means monitors the first data stream and compares the first data stream to the second data stream if the first compression/decompression means is the master device.

10. The method of claim 9 further comprising the step of:
providing a common bus, the common bus for coupling the first compression/decompression means and the second compression/decompression means.

11. The method of claim 10 wherein the common bus further comprises a RAMBUS.

12. The method of claim 11 wherein:
the step of providing the first compression/decompression means further comprises the step of providing a first content addressable memory and a first decoder coupled to the first content addressable memory; and
the step of providing the second compression/decompression means further comprises the step of providing a second content addressable memory and a second decoder coupled to the second content addressable memory.

13. The method of claim 12 further comprising the step of providing a controller coupled to the first compression/decompression means and the second compression/decompression means for designating one of the first compression/decompression means or the second compression/decompression means as the master device and the other of the first compression/decompression means or the second compression/decompression means as a slave device.

14. The method of claim 13 wherein:
the step of providing the first compression/decompression means further comprises the step of providing a first comparing means for comparing the second output to the first output if the second compression/decompression means is a master device; and
the step of providing the second compression/decompression means further comprises the step of providing a second comparing means for comparing the first output to the second output if the first compression/decompression means is a master device.

15. The method of claim 14 wherein the first comparing means further comprises a comparator; and the second comparing means further comprises a comparator.

16. The method of claim 15 wherein the controller designates the first compression/decompression means as the master device and the second compression/decompression means as the slave device when data is provided via the first interface, and designates the first compression/decompression means as the slave device and the second compression/decompression as the master device when the data is provided via the second interface.

17. A method for providing high integrity compression of data at low cost comprising the steps of:
(a) performing a first error check on the data;
(b) storing the first error check;
(c) providing the data to a compression/decompression means;
(d) compressing the data to provide a data stream, the step of compressing the data further includes the steps of
(d1) compressing the data to provide the data stream, and
(d2) performing a second error check on the data stream;
(e) storing the data stream, the step of storing the data stream including the steps of
(e1) storing the data stream, and
(e2) storing the second error check;
(f) providing the data stream to the compression/decompression means, the step of providing the data stream to the compression/decompression means including the steps of
(f1) providing the data stream to the compression/decompression means;
(f2) performing a third error check on the data stream provided to the compression/decompression means; and
(f3) comparing the third error check to the second error check;
(g) decompressing the data stream;
(h) performing a fourth error check on the decompressed output; and
(i) comparing the fourth error check to the first error check.

18. The method of claim 17 wherein step (c) providing the data to the compression/decompression means further comprises the steps of:

(c1) providing the data stream to the compression/decompression means;

(c2) performing a fifth error check on the data provided to the compression/decompression means; and (c3) comparing the fifth error check to the first error check.

19. The method of claim 18 wherein steps (c1), (c2), (d1), (d2), and (e1) occur simultaneously.

20. The method of claim 19 wherein steps (f1), (f2), (g), and (h) occur substantially simultaneously.

21. A method for providing high integrity decompression of data at low cost comprising the steps of:

(a) performing a first error check on the data;

(b) storing the first error check;

(c) providing the data to a compression/decompression means;

(d) decompressing the data to provide the data stream, the step of decompressing the data further including the steps of (d1) decompressing the data to provide the data stream, and (d2) performing a second error check on the data stream;

(e) storing the data stream, the step of storing the data stream further including the steps of (e1) storing the data stream, and (e2) storing the second error check;

(f) providing the data stream to the compression/decompression means, the step of providing the data stream to the compression/decompression means further including the steps of (f1) providing the data stream to the compression/decompression means;

(f2) performing a third error check on the data stream provided to the compression/decompression means; and (f3) comparing the third error check to the third error check (g) compressing the data stream;

(h) performing a fourth error check on the compressed data stream; and (i) comparing the fourth error check to the first error check.

22. The method of claim 23 wherein step (c) providing the data to the compression/decompression means further comprises the steps of:

(c1) providing the data stream to the compression/decompression means;

(c2) performing a fifth error check on the data provided to the compression/decompression means; and (c3) comparing the fifth error check to the first error check.

23. The method of claim 22 wherein steps (c1), (c2), (d1), (d2), and (e1) occur simultaneously.

24. The method of claim 23 wherein steps (f1), (f2), (g), and (h) occur substantially simultaneously.

25. A system for providing compression of data with high data integrity at low cost, the system including a storage means and an interface, the system comprising:

a single compressor/decompressor coupled to the storage means and the interface for compressing data provided from the interface and decompressing compressed data provided by the storage means; wherein the single compressor/decompressor alternatively compresses a portion of the data to provide a compressed data stream and decompresses a portion of the compressed data stream, the portion of the compressed data stream corresponding to the portion of the data;

error comparing means for comparing the portion of the data to the portion of the compressed data stream after decompression; and wherein the storage means further includes a buffer having a plurality of sections, a first section of the plurality of sections for storing the portion of the data, a second section of the plurality of sections for storing a first error check of the portion of the data, a third section of the plurality of sections for storing the portion of the compressed data stream, and a fourth section of the plurality of sections for storing a second error check of the portion of the compressed data stream.

26. The system of claim 25 wherein the error comparing means further comprises:

first error check means for performing a first error check on the portion of the data;

second error check means for performing a second error check on the portion of the compressed data stream after decompression; and comparing means for comparing the first error check to the second error check.

27. The system of claim 26 wherein the first error check means further comprises means for performing a first sumcheck; and the second error check means further comprises means for performing a second sumcheck.

28. The system of claim 27 wherein the single compressor/decompressor further comprises a content addressable memory and a decoder coupled to the content addressable memory.

29. A system for providing decompression of data with high data integrity at low cost, the system including a storage means and an interface, the system comprising:

a single compressor/decompressor coupled to the storage means and the interface for compressing data provided from the interface and decompressing compressed data provided by the storage means; wherein the single compressor/decompressor alternatively decompresses a portion of the compressed data to provide a data stream and compresses a portion of the data stream, the portion of the data stream corresponding to the portion of the compressed data;

error comparing means for comparing the portion of the compressed data to the portion of the data stream after compression; and wherein the storage means further includes a buffer having a plurality of sections, a first section of the plurality of sections for storing the portion of the compressed data, a second section of the plurality of sections for storing a first error check of the portion of the compressed data, a third section of the plurality of sections for storing the portion of the data stream, and a fourth section of the plurality of sections for storing a second error check of the portion of the data stream.

30. The system of claim 29 wherein the error comparing means further comprises:

first error check means for performing a first error check on the portion of the compressed data;

second error check means for performing a second error check on the portion of the data stream after compression; and comparing means for comparing the first error check to the second error check.

31. The system of claim 30 wherein the first error check means further comprises means for performing a first sumcheck; and the second error check means further comprises means for performing a second sumcheck.

32. The system of claim 31 wherein the single compressor/decompressor further comprises a content addressable memory and a decoder coupled to the content addressable memory.

* * * * *